United States Patent [19]
Tamaki et al.

[11] Patent Number: 4,942,451
[45] Date of Patent: Jul. 17, 1990

[54] SEMICONDUCTOR DEVICE HAVING IMPROVED ANTIREFLECTION COATING

[75] Inventors: Reiji Tamaki; Shigeru Harada, both of Hyogo, Japan

[73] Assignee: Mitsubishi Denki Kabushiki Kaisha, Tokyo, Japan

[21] Appl. No.: 249,907

[22] Filed: Sep. 27, 1988

[51] Int. Cl.⁵ .............................................. H01L 23/48
[52] U.S. Cl. ......................................... 357/67; 357/71
[58] Field of Search ..................................... 357/67, 71

[56] References Cited

FOREIGN PATENT DOCUMENTS 62-261154  11/1987  Japan .
62-281353  12/1987  Japan .

OTHER PUBLICATIONS

T. Tatsuzawa et al., "St Nodule Formation in Al—Si Metallization", (Sep. 1985), Intel. Reliability Physics Symposium Proceedings, pp. 138–141.
D. Pramanik et al., "VLSI Metallization Using Aluminum and its Alloys", Solid State Technology (Mar. 1983), pp. 131–137.

Primary Examiner—Andrew J. James
Assistant Examiner—Mark Prenty
Attorney, Agent, or Firm—Lowe, Price, LeBlanc, Becker & Shur

[57] ABSTRACT

A semiconductor device comprises a semiconductor substrate containing silicon as a constituent element, an impurity diffused layer formed in a predetermined region of the semiconductor substrate, an underlayer oxide film formed on the surface of the semiconductor substrate, an Al-Si alloy interconnection electrically connected to the impurity diffused layer through a contact hole and formed in a predetermined region on the underlayer insulating film, and an antireflection coating comprising a layer of an Al-Si-Sb alloy or a layer of an Al-Si-Sn alloy formed on the alloy interconnection.

5 Claims, 1 Drawing Sheet

SEMICONDUCTOR DEVICE HAVING IMPROVED ANTIREFLECTION COATING

BACKGROUND OF THE INVENTION

1. Field of the Invention

The present invention relates generally to semiconductor devices, and more particularly, to an improvement of an antireflection coating formed on an interconnection layer for preventing reflection of exposure light used at the time of photolithography of an interconnection.

2. Description of the Prior Art

FIG. 1 is a cross sectional view showing schematically a structure of a contact hole portion of a conventional semiconductor device. In FIG. 1, the conventional semiconductor device comprises a semiconductor substrate 1 of silicon, an impurity diffused layer 2 formed in a predetermined region on the surface of the semiconductor substrate 1 to serve as an active region, an underlayer insulating film 3 comprising a silicon oxide film or the like formed for the purpose of protecting and stabilizing the surface of the semiconductor substrate 1, an interconnection of an aluminum-silicon alloy (referred to as Al-Si alloy interconnection hereinafter) 4 formed in a predetermined region on the underlayer insulating film 3 and electrically connected to the impurity diffused layer 2 through a contact hole 10, and an antireflection coating 5 of an aluminum-silicon alloy formed on the Al-Si alloy interconnection 4 for preventing reflection of exposure light irradiated at the time of photolithography for patterning the Al-Si alloy interconnection 4 in a predetermined shape. Referring now to FIG. 1, a method for forming the interconnection of the conventional semiconductor device will be briefly described.

After a resist film having a predetermined shape is formed on the surface of the semiconductor substrate 1 using a photolithographic technique, an impurity diffused layer 2 is formed in a predetermined region of the surface of the semiconductor substrate 1 using an ion implantation process or the like utilizing this patterned resist film as a mask. An underlayer insulating film 3 comprising a silicon oxide film or the like is then formed on the exposed entire surface using a CVD process or the like for the purpose of protecting and stabilizing the surface of the semiconductor substrate 1. A contact hole 10 is then formed in a predetermined region of the underlayer insulating film 3 using photolithographic and etching techniques in order to make electrical connection to the impurity diffused layer 2. A thin film of an Al-Si alloy containing 0.5 to 2.0% silicon by weight is then formed on the underlayer insulating film 3 and the exposed surface of the semiconductor substrate 1 using a spattering process or the like.

Additionally, in order to prevent reflection of exposure light irradiated in a photolithographic process for patterning a thin film of an alloy on the thin film of an Al-Si alloy in a predetermined shape to form an interconnection, a thin film 5 of Al-Si alloy, 100 to 500Å in thickness, containing 20 to 50% silicon by weight, is formed using an evaporation process for the purpose of reducing reflectivity to the exposure light. Thereafter, etching is made utilizing as a mask a resist film (not shown) patterned in a predetermined shape by a photolithographic process, to form the Al-Si alloy interconnection 4 having a predetermined shape. It is to prevent occurrence of an alloy pit caused as a result of the reaction between aluminum of the interconnection and the impurity diffused layer in a heat-treating process for achieving good ohmic contact of the interconnection with the impurity diffused layer that the Al-Si alloy is used as an interconnection material. This alloy pit causes "punch through" of the diffused layer when the depth of the diffused layer is small, which causes an electrical short between the substrate and the interconnection.

The antireflection coating having a thickness of approximately 100 to 500Å is formed to prevent exposure light from being reflected from the thin film of an alloy of an underlayer and thus even a photoresist film in an undesired portion from being exposed in the photolithographic process of a photoresist film, thereby to obtain a desired patterning precision.

The Al-Si alloy interconnection 4 formed in the above described manner is generally heat-treated for about several ten minutes at a temperature of 400 to 500° C. in an atmosphere of nitrogen or hydrogen in order to achieve good ohmic contact between the alloy interconnection 4 and the impurity diffused layer 2. In this heat-treating process, silicon in the antireflection coating 5 containing silicon at a high concentration diffuses into the Al-Si alloy interconnection 4, so that the concentration of silicon in the alloy interconnection 4 is increased. As a result, the concentration of silicon in the alloy interconnection 4 exceeds the limit of solid solubility, so that silicon is easily deposited in the interface of the alloy interconnection 4 and the semiconductor substrate 1 of silicon by solid phase epitaxial growth in which substrate silicon is used as a seed crystal. This deposited silicon 6 is close to an intrinsic semiconductor and has a high specific resistance value. Thus, if the deposited silicon 6 is formed in a part or all of the contact hole 10, contact resistance between the alloy interconnection 4 and the impurity diffused layer 2 becomes high, which causes electrical failures.

Furthermore, in this heat-treating process, silicon which exceeds the limit of solid solubility is deposited in the Al-Si alloy interconnection 4 on the underlayer insulating film 3 comprising a silicon oxide film, so that a mass of silicon referred to as a silicon nodule 7 is formed. This silicon nodule 7 is also close to the intrinsic semiconductor and has a very high specific resistance value. In addition, the silicon nodule grows to the size of approximately 1μm. Thus, the effective cross-sectional area of the interconnection becomes relatively small and the current density in this portion is substantially increased, so that failures such as disconnection due to electromigration are liable to occur, thereby to decrease electromigration resistance of the interconnection.

More specifically, in the conventional semiconductor device, the film of an aluminum-silicon alloy containing 20 to 50% silicon by weight is used as an antireflection coating for preventing reflection of exposure light at the time of photolithography for forming the Al-Si alloy interconnection. Thus, by heat treatment for achieving good ohmic contact between the interconnection and the impurity diffused layer, silicon may be deposited in the contact hole portion by solid phase epitaxial growth and the silicon nodule may occur in the alloy interconnection on the underlayer insulating film by deposition of silicon, so that electrical failures caused by the increase in contact resistance occur and disconnection of the interconnection due to electromigration occurs.

SUMMARY OF THE INVENTION

Therefore, an object of the present invention is to solve the above described problems and to provide a semiconductor device employing an antireflection coating which can prevent deposition of silicon and occurrence of a silicon nodule and satisfactorily perform a function as an antireflection coating.

The semiconductor device according to the present invention uses a film of an alloy having at least one type of element in a group adjacent, in the periodic table, to that of a constituent element of a semiconductor substrate added to aluminum and having the content of silicon reduced to almost the same as or less than the content of silicon in an interconnection layer of an underlayer, as an antireflection coating formed on the interconnection layer of an underlayer for preventing reflection of exposure light irradiated in a photolithographic process for interconnection patterning from the interconnection layer.

In the semiconductor device according to the present invention, reflectivity to exposure light is substantially decreased by providing the antireflection coating containing the element in the group adjacent, in the periodic table, to that of the constituent element of the semiconductor substrate added in small quantities and the content of silicon in the antireflection coating is substantially decreased, so that silicon diffuses into the interconnection layer from the antireflection coating in a heat-treating process for achieving good ohmic contact between the interconnection layer and an impurity diffused layer, whereby the concentration of silicon in the interconnection layer is not increased. Thus, the antireflection coating according to the present invention can prevent deposition of silicon in a contact hole portion and occurrence of a silicon nodule in the interconnection layer.

In a preferred embodiment, the constituent element of the semiconductor substrate is silicon. The antireflection coating includes silicon. At least one type of element in a group consisting of boron, gallium, indium, thallium, phosphorus, arsenic, antimony and bismuth is added to the silicon, the amount of addition thereof being selected to be 0.05 to 10% by weight.

A semiconductor device according to another invention uses a film of alloy having at least one type of element in the same group, in the periodic table, as that of a constituent element of a semiconductor substrate added to aluminum and having the content of silicon decreased to almost the same as or less than the content of silicon of an interconnection layer of an underlayer, as an antireflection coating formed on the interconnection layer.

Thus, in the semiconductor device according to the present invention, reflectivity to exposure light is substantially decreased by providing the antireflection coating containing the element in the same group, in the periodic table, as that of the constituent element of the semiconductor substrate added in small quantities and the content of silicon in the antireflection coating is substantially decreased, so that silicon diffuses into the interconnection layer from the antireflection coating in a heat-treating process for achieving good ohmic contact between the interconnection layer and an impurity diffused layer, whereby the concentration of silicon in the interconnection layer is not increased. Thus, the antireflection coating according to the present invention can prevent deposition of silicon in a contact hole region and occurrence of a silicon nodule in the interconnection layer.

In a more preferred embodiment, the constituent element of the semiconductor substrate is silicon. The antireflection coating includes silicon. In addition, at least one type of element in a group consisting of tin, carbon, germanium and lead is added to the antireflection coating, the amount of addition thereof being 0.05 to 10% by weight.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
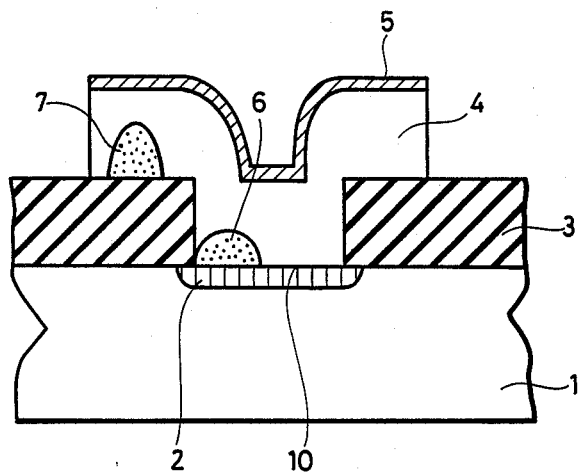
FIG. 1 is a diagram showing a cross-sectional structure of a semiconductor device using a conventional antireflection coating.
Figure 2:
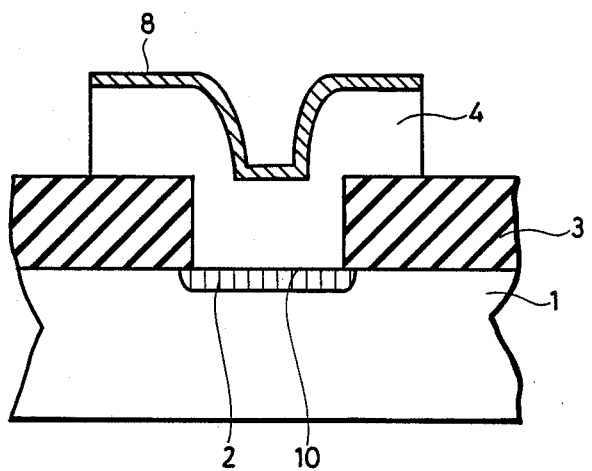
FIG. 2 is a diagram showing a schematic cross-sectional structure of a semiconductor device using an antireflection coating according to one embodiment of the present invention.

FIG. 2 is a diagram showing a schematic cross-sectional structure in a contact hole region of a semiconductor substrate using an antireflection coating according to one embodiment of the present invention. In FIG. 2, the semiconductor device comprises a semiconductor substrate 1 having silicon as a constituent element, an impurity diffused layer 2 formed in a predetermined region of the semiconductor substrate 1, an underlayer oxide film 3 formed on the surface of the semiconductor substrate 1, an Al-Si alloy interconnection 4 electrically connected to the impurity diffused layer 2 through a contact hole 10 and formed in a predetermined region on the underlayer insulating film 3, and an antireflection coating 8 formed of a layer of an Al-Si-Sb alloy formed on the alloy interconnection 4.

Referring now to FIG. 2, a method for manufacturing a semiconductor device according to one embodiment of the present invention will be briefly described.

An impurity diffused layer 2 serving as an active region is formed in a predetermined region of the surface of the semiconductor substrate 1 of silicon using photolithographic techniques, an ion implantation process and the like. An underlayer insulating film 3 comprising a silicon oxide film or the like is then formed using a CVD process or the like for the purpose of protecting and stabilizing the surface of the semiconductor substrate 1. A contact hole 10 is then formed in a predetermined region of the underlayer insulating film 3 using photolithographic and etching techniques in order to make electrical connection to the impurity diffused layer 2.

A film of an Al-Si alloy containing 0.5 to 2.0% silicon by weight is then formed using a spattering process, a vacuum evaporation process or the like. In addition, an antireflection coating 8 is formed on this film of an alloy. The antireflection coating 8 comprises a film of an Al-Si-Sb alloy containing 0.05 to 10% antimony by weight which can decrease reflectivity to exposure light in small quantities and 0.5 to 2.0% silicon by weight, as in the film of an Al-Si alloy of an underlayer.

Thereafter, the photolithographic process is carried out for patterning the film of an Al-Si alloy. More specifically, after the antireflection coating 8 is coated with a photoresist film (not shown), exposure light is irradiated, to pattern the photoresist film in a predetermined shape. On this occasion, the content of silicon in the antireflection coating 8 is substantially decreased, as compared with the conventional example. However, antimony which can decrease reflectivity to exposure light is added to the antireflection coating 8, so that only a desired region of the resist film is exposed without receiving reflected light of exposure light from the underlayer, to be patterned in a desired shape with a high precision. Etching is made utilizing this patterned resist film as a mask, so that the antireflection coating 8 and the Al-Si alloy film are patterned, whereby the Al-Si alloy interconnection 4 is formed.

In order to achieve good ohmic contact between the alloy interconnection 4 and the impurity diffused layer 2, heat treatment is then performed for several ten minutes at a temperature of 400 to 500° C. in an atmosphere of hydrogen or nitrogen, so that eutectic reaction takes place in the interface of the interconnection 4 and the impurity diffused layer 2. In this heat-treating process, the content of silicon in the antireflection coating 8 is decreased to the same degree as that of the interconnection 4 of an underlayer, so that silicon does not diffuse into the interconnection 4 from the antireflection coating 8. Thus, silicon is not deposited in a contact hole region and a silicon nodule does not occur in the interconnection layer on the underlayer insulating film.

Since antimony is an element which can decrease reflectivity to exposure light of the antireflection coating in small quantities and in a group adjacent to silicon which is a constituent element of a semiconductor substrate, the physical property thereof is similar to that of silicon. Thus, even if antimony is added to the antireflection coating 8, there is no possibility that the antimony becomes a movable ion, so that there is no possibility that the antimony adversely affects the characteristics of a semiconductor device.

Additionally, alloy reaction between antimony and aluminum does not take place, unlike copper generally added to increase electromigration resistance during interconnection thereby to improve life characteristics, so that electrical failures caused by segregation never occur.

Although in the above described embodiment, the film of an aluminum alloy containing silicon is used as an antireflection coating, it is not necessary to contain silicon. An alloy consisting of aluminum and antimony may be used, to obtain the same effect as that of the above described embodiment.

Furthermore, although in the above described embodiment, description was made on a case in which antimony is used as an element added to an antireflection coating in small quantities, it should be noted that the element is not limited to the same. For example, either one of phosphorus, arsenic and bismuth in Group V adjacent to that of silicon which is a constituent element of a semiconductor substrate or boron, gallium, indium and thallium in Group III may be used, to obtain the same effect.

Although in the above described embodiment, one type of element out of elements in Group III and Group V is added in small quantities, two or more types of elements in Group III and Group V may be added, to obtain the same effect as that of the above described embodiment. In this case, it is necessary that the amount of addition of each element is in the range of 0.05 to 10% by weight.

As described in the foregoing, according to the embodiment of the present invention, since a film of an aluminum alloy having at least one type of element in a group adjacent, in the periodic table, to that of a constituent element of a semiconductor substrate added thereto is used as an antireflection coating and the content of silicon in the antireflection coating is decreased, the function of the antireflection coating is not lost, so that silicon does not diffuse into an interconnection layer from the antireflection coating in a heat-treating process for achieving ohmic contact. Thus, deposition of silicon in a contact hole region and occurrence of a silicon nodule in the interconnection layer can be controlled and the increase in contact resistance and the increase in electromigration resistance can be prevented, whereby a stable and reliable semiconductor device can be achieved.

Although in the above described embodiment, one type of element out of elements in Group III and Group V is added as an element added in small quantities, the present invention is not limited to the same. As another embodiment, any of tin, carbon, germanium and lead in the same Group IV, in the periodic table, as that of silicon which is a constituent element of a semiconductor substrate may be added, to prevent occurrence of a silicon nodule on the silicon oxide film 3. Also in this case, silicon need not be included as the antireflection coating 8. Thus, an alloy having an element in Group IV in the periodic table added to aluminum including no silicon may be used. In addition, two or more types of elements in Group IV in the periodic table may be added.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device formed in a predetermined region of a semiconductor substrate and including an impurity diffused layer to serve as an active region, comprising:

an interconnection layer formed on said semiconductor substrate so as to receive and send electrical signals from and to said impurity diffused layer, and an antireflection coating containing aluminum as a major constituent and formed on said interconnection layer so as to prevent reflection of exposure light irradiated for patterning a resist film utilized as a mask when said interconnection layer is patterned in a predetermined shape, said antireflection coating additionally comprising a second element which is the same as an element contained in the substrate and at least a third element in a group adjacent, in the periodic table, to a group to which said second element belongs.

2. The semiconductor device according to claim 1, wherein said second element is silicon.

3. The semiconductor device according to claim 1, wherein said third element is selected from the group consisting of boron, gallium, indium, thallium, phosphorus, arsenic, antimony and bismuth.

4. The semiconductor device according to claim 1, wherein
the amount of said third element in said antireflection coating is 0.05 to 10 percent by weight.

5. The semiconductor device according to claim 1, wherein
said third element is selected from the group consisting of tin, carbon, germanium and lead.

* * * * *